United States Patent
Iwata et al.

(10) Patent No.: US 6,201,285 B1
(45) Date of Patent: Mar. 13, 2001

(54) SENSOR WITH DIAPHRAGM SENSOR CHIP

(75) Inventors: Hitoshi Iwata; Masakata Kanbe, both of Aichi-ken (JP)

(73) Assignee: Kabushiki Kaisha Tokai Rika Denki Seisakusho, Aichi-ken (JP)

( * ) Notice: Subject to any disclaimer, the term of this patent is extended or adjusted under 35 U.S.C. 154(b) by 0 days.

(21) Appl. No.: 09/462,011

(22) PCT Filed: Jul. 2, 1998

(86) PCT No.: PCT/JP98/02992

§ 371 Date: Dec. 29, 1999

§ 102(e) Date: Dec. 29, 1999

(87) PCT Pub. No.: WO99/01771

PCT Pub. Date: Jan. 14, 1999

(30) Foreign Application Priority Data

Jul. 4, 1997 (JP) .................................................... 9-179598

(51) Int. Cl.[7] .................................................... H01L 29/82
(52) U.S. Cl. ........................ 257/419; 257/417; 257/666; 257/787
(58) Field of Search .................... 257/417, 414, 257/419, 666, 747, 787

(56) References Cited

U.S. PATENT DOCUMENTS

| | | | |
|---|---|---|---|
| 4,314,225 | * | 2/1982 | Tominaga et al. . |
| 5,070,041 | * | 12/1991 | Katayama et al. . |
| 5,436,491 | * | 7/1995 | Hase et al. . |
| 5,594,236 | * | 1/1997 | Suzuki et al. . |
| 6,072,232 | * | 6/2000 | Li et al. . |

FOREIGN PATENT DOCUMENTS

| | | |
|---|---|---|
| 62-175633 | 8/1987 | (JP) . |
| 5-288722 | 11/1993 | (JP) . |
| 7-225240 | 8/1995 | (JP) . |
| 7-283248 | 10/1995 | (JP) . |
| 7-302863 | 11/1995 | (JP) . |
| 9-145510 | 6/1997 | (JP) . |

* cited by examiner

Primary Examiner—Sheila V. Clark
(74) Attorney, Agent, or Firm—Nawrocki, Rooney & Sivertson, P.A.

(57) ABSTRACT

An acceleration sensor with a diaphragm sensor chip has lead frames. One of the lead frames has a die pad. The sensor chip is flexibly adhered to the die pad by adhesive. The sensor chip has a diaphragm. The sensor chip outputs signals in accordance with flexure of the diaphragm. The lead frames are molded by a mold member. The mold member define a space about the sensor chip. The coefficient of linear expansion of the mold member is between $1.4 \times 10^{-5}/°$ C. and $1.8 \times 10^{-5}/°$ C., and the modulus of elasticity of the mold member is between $100 \times 10^3$ kg/cm$^2$ and $130 \times 10^3$ kg/cm$^2$. Use of the mold member minimizes the ratio of change of sensitivity due to temperature changes, which improves the temperature characteristics of the sensor.

7 Claims, 5 Drawing Sheets

Fig.5

| sample | A | B | C | D | E | F | G |
|---|---|---|---|---|---|---|---|
| coefficient of linear expansion (/°C) | $2.5 \times 10^{-5}$ | $2.2 \times 10^{-5}$ | $1.4 \times 10^{-5}$ | $1.8 \times 10^{-5}$ | $1.5 \times 10^{-5}$ | $1.7 \times 10^{-5}$ | $1.9 \times 10^{-5}$ |
| modulus of elasticity (kg/cm²) | $75 \times 10^3$ | $140 \times 10^3$ | $120 \times 10^3$ | $120 \times 10^3$ | $123 \times 10^3$ | $113 \times 10^3$ | $200 \times 10^3$ |
| TSS (%) | 15 | 12 | within ±3 | within ±3 | within ±3 | within ±3 | −30 |
| evaluation | X | X | ○ | ○ | ○ | ◎ | X |

X : No Good   ○ : Good   ◎ : Very Good

SENSOR WITH DIAPHRAGM SENSOR CHIP

BACKGROUND OF THE INVENTION

The present invention relates to a sensor with a diaphragm sensor chip.

Acceleration sensors using diaphragm type pressure sensitive sensor chips have been proposed.

A pressure sensor chip used in such acceleration sensors has a relatively thick base and thin diaphragm. Stain gauges are formed on the surface of the diaphragm by thin-film forming technology. The strain gauges form a bridge circuit. The base of the sensor chip is flexibly adhered to a die pad having lead frames with an adhesive. The lead frames are entirely molded over with a mold material. A space exists about the sensor chip, which is die bonded. The space is filled with silicone gel, which seals the chip.

Each material of the sensor has its own property of thermal deformation. Metal used for the sensor chip and the lead frames has a relatively low coefficient of linear expansion. Resin used for the mold member and the adhesive has a greater coefficient of linear expansion than that of the metal. Great differences of thermal deformation among the materials tends to apply stress to the diaphragm when the ambient temperature changes. This deforms the strain gauges and changes the resistance of the gauges. As a result, the sensitivity of the sensor is changed. Accordingly, the temperature characteristics of the sensor deteriorate.

A few measures have been introduced to address the above draw back. A first measure is to adhere a small ceramic substrate on the die pad and to flexibly attach the sensor chip on the ceramic substrate with elastomer. A second measure is to provide a compensation circuit outside the sensor for electrically compensating the sensor detection signals. These measures have decreased the ratio of change of sensitivity from ±10 to 30% to ±5%, which is within the tolerance.

However, the first measure requires a ceramic substrate and therefore increases the material cost: In addition, the first measure requires a manufacturing step for adhering the ceramic substrate and therefore complicates the assembly. This lowers the production efficiency.

The second measure requires a compensation circuit and thus increases the cost.

Accordingly, it is an objective of the present invention to provide a sensor having a diaphragm sensor chip that is inexpensive and easy to manufacture, and the sensitivity of which is not greatly affected by temperature.

SUMMARY OF THE INVENTION

To achieve the forgoing and other objectives and in accordance with the purpose of the invention, a sensor is provided. The sensor has a lead frame including a die pad, and a sensor chip flexibly secured on the die pad by adhesive. The sensor chip includes a diaphragm and outputs signals corresponding to strain amount of the diaphragm. A mold member molds the lead frame and defines a space about the sensor chip. The coefficient of linear expansion of the mold member is between $1.4 \times 10^{-5}/°$ C. and $1.8 \times 10^{-5}/°$ C., and the modulus of elasticity of the mold member is between $100 \times 10^3$ kg/cm$^2$ and $130 \times 10^3$ kg/cm$^2$.

A relatively great volume of the sensor is occupied by a mold member. Therefore, thermal stress generated in the mold member greatly affects the magnitude of thermal stress acting on a diaphragm. In this invention, the mold member has proper characteristics (the coefficient of linear expansion and the modulus of elasticity). Therefore, the difference of the thermal stress amounts among the parts is decreased, which eliminates deformation of the diaphragm. Thus, the ratio of change of sensitivity due to temperature changes is minimized.

Conventionally, a sensor chip is flexibly adhered to a ceramics substrate to decrease the ratio of change of sensitivity due to temperature changes. Alternatively, a separate compensation circuit is connected to a sensor. The present invention reduces the ratio of change of sensor sensitivity due to temperature changes without using these conventional measures. This reduces the manufacturing cost of the sensor and facilitates the manufacture.

BRIEF DESCRIPTION OF THE DRAWINGS

FIG. 5 is a chart showing experimental results for comparing various mold members.

DETAILED DESCRIPTION OF THE INVENTION

An acceleration sensor having a diaphragm sensor chip according to one embodiment of the present invention will now be described with reference to FIGS. 1 to 5.

Figure 1:
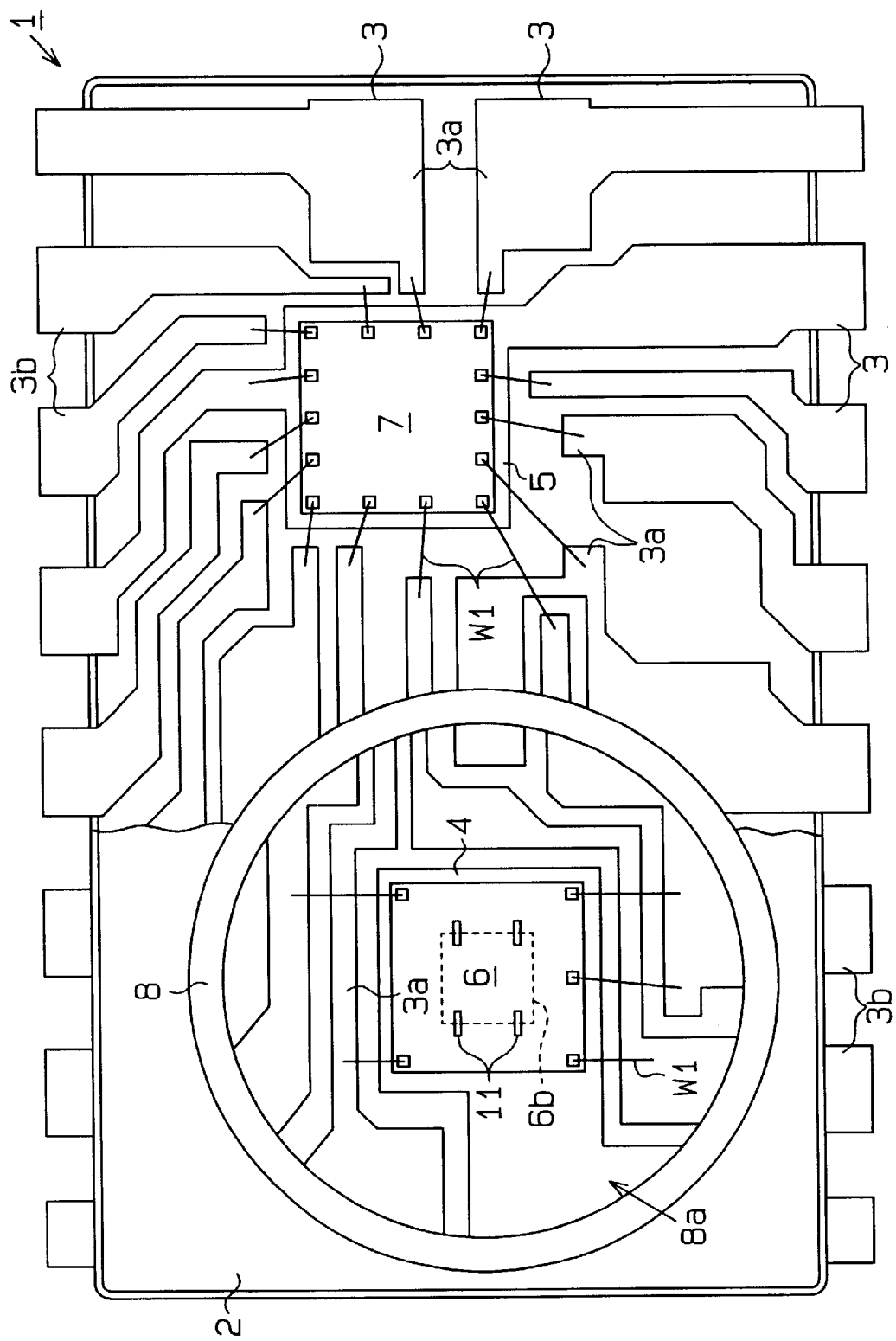
FIG. 1 is a top view, with a part cut away, illustrating an acceleration sensor according to a first embodiment of the present invention.
Figure 2:
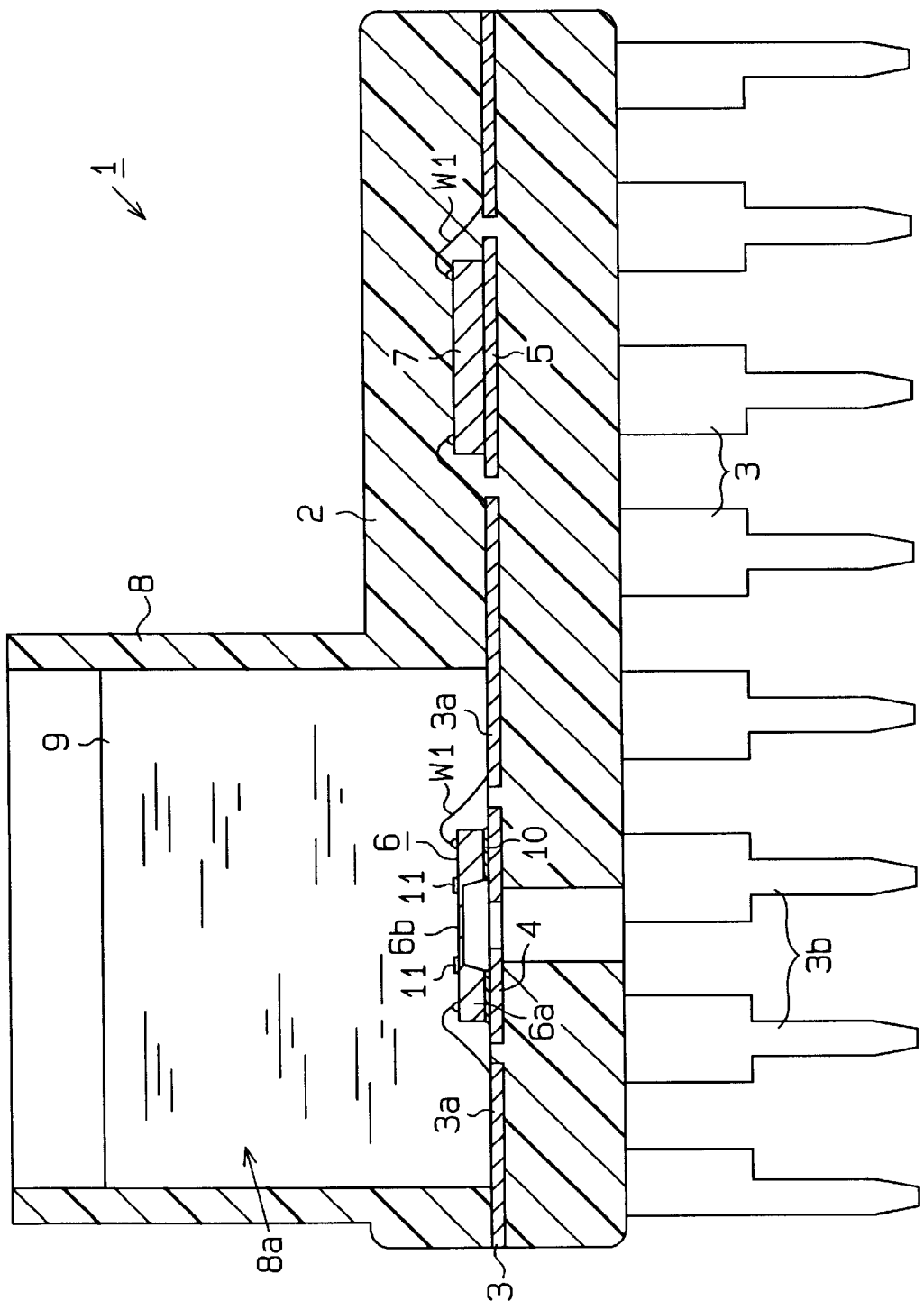
FIG. 2 is a cross-sectional view illustrating the acceleration sensor of FIG. 1.

As shown in FIGS. 1 and 2, an acceleration sensor 1 has a plastic mold package. A mold member 2 is an insulator and is molded over lead frames 3. Each lead frame 3 includes an inner lead 3a covered by the mold member 2 and an outer lead 3b protruding from the mold member 2. The outer leads 3b function as external connectors.

The lead frames 3 include a lead frame 3 having a die pad 4 and two lead frames 3 connected to each other by a die pad 5. The other lead frames 3 each have an inner lead 3a located about the die pads 4, 5. A pressure sensor chip 6 is bonded onto the die pad 4. A signal processing IC chip 7 is bonded onto the die pad 5. The sensor chip 6 is connected to some of the inner leads 3a by bonding wires W1. The IC chip 7 is connected to most of the inner leads 3a by the bonding wires W1.

The mold member 2 has a cylinder 8, which surrounds the sensor chip 6 on the die pad 4. The sensor chip 6, which is located at the bottom of the cylinder 8, and the inner leads 3a located at the bottom of the cylinder 8 are not covered by the mold member 2. In other words, the sensor chip 6 is located in a space 8a surrounded by the cylinder 8. The space 8a is filled with silicone gel 9, which seals the sensor chip 6. The silicone gel 9 also transmits acceleration to the sensor chip 6.

Figure 3:
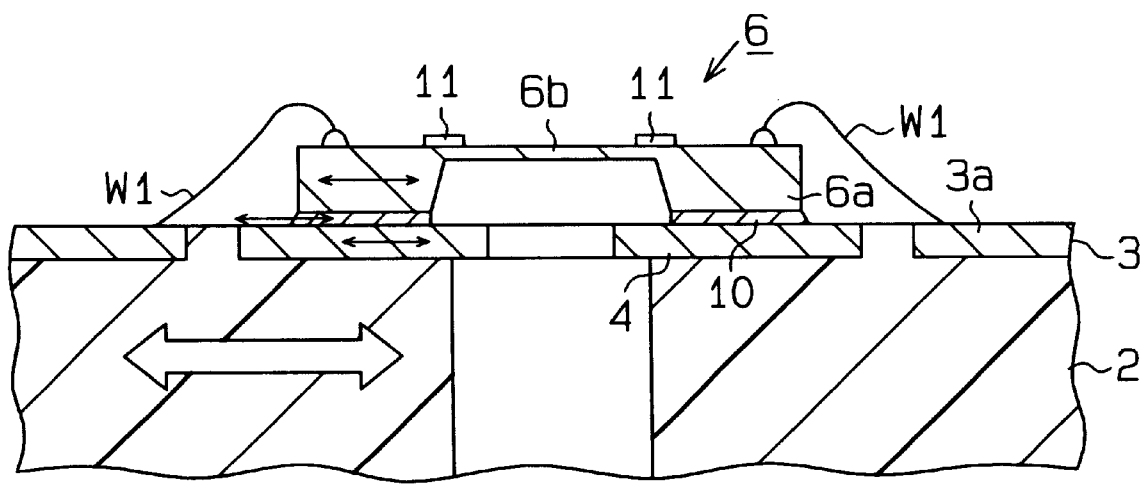
FIG. 3 is an enlarged cross-sectional view of FIG. 2 showing thermal stress in parts of the sensor.

As shown in FIGS. 2 and 3, the sensor chip 6 includes a thick base 6a and a thin diaphragm 6b. Strain gauges 11 are formed on the surface of the diaphragm 6b by a thin film forming technique such as sputtering. The strain gauges 11 form a bridge circuit. Output signals from the bridge circuit are processed by the IC chip 7 and sent to the exterior of the sensor 1 through the outer leads 3b.

The base 6a of the sensor chip 6 is secured to the die pad 4 with an adhesive 10. The adhesive 10 is preferably a silicone type, which enables a flexible adhesion. In this embodiment, the adhesive 10 is a silicone rubber type thermosetting one-component adhesive. The coefficient of linear expansion of the adhesive 10 is $55 \times 10^{-5}/°$ C., and the modulus of elasticity of the adhesive 10 is $0.06 \times 10^3$ kg/cm$^2$.

The diaphragm 6b receives acceleration via the silicone gel 9. The diaphragm 6b is flexed in accordance with the magnitude and the direction of the acceleration. Specifically, when the acceleration sensor 1 is accelerated downward as viewed in FIG. 2, the diaphragm 6b is flexed upward. When the acceleration sensor 1 is accelerated upward as viewed in FIG. 2, the diaphragm 6b is flexed downward. Flexure of the diaphragm 6b changes the resistance of the gauges 11. The acceleration is detected based on the changes of the resistance.

The coefficient of linear expansion of the mold member 2 is preferably between $1.4 \times 10^{-5}/°$ C. and $1.8 \times 10^{-5}/°$ C., and the modulus of elasticity of the mold member 2 is preferably between $100 \times 10^3$ kg/cm$^2$ and $130 \times 10^3$ kg/cm$^2$. More preferably, the coefficient of linear expansion of the mold member 2 is between $1.6 \times 10^{-5}/°$ C. and $1.7 \times 10^{-5}/°$ C., and the modulus of elasticity of the mold member 2 is between $105 \times 10^3$ kg/cm$^2$ and $115 \times 10^3$ kg/cm$^2$. These preferable ranges were obtained from the following comparison experiments.

The manufacturing process of the acceleration sensor 1 will now be described. First, the lead frames 3 having a predetermined pattern are formed by pressing or etching a plate made of conductive metal such as 42 alloy. In this embodiment, the lead frames 3 are formed with 42 alloy and have a thickness between 0.25 mm and 0.5 mm. The 42 alloy refers to an iron alloy including nickel, in which the percentage by weight of the nickel is 42 percent. The average coefficient of linear expansion of the 42 alloy is between $0.67 \times 10^{-5}/°$ C. and $0.68 \times 10^{-5}/°$ C., and the modulus of elasticity of the 42 alloy is substantially $0.15 \times 10^3$ kg/cm$^2$.

The sensor chip 6 and the IC chip 7 are previously formed. In this embodiment, a silicon chip having a thickness of 0.5 mm to 0.6 mm is used as the sensor chip 6. The coefficient of linear expansion of silicon is between $0.26 \times 10^{-5}/°$ C. and $0.36 \times 10^{-5}/°$ C., and the modulus of elasticity of silicon is between $1000 \times 10^3$ kg/cm$^2$ and $1600 \times 10^3$ kg/cm$^2$.

After forming the lead frames 3, the lead frames 3 are set in a screen printer. The liquid silicone rubber adhesive 10 is applied to the die pads 4, 5 by a conventional method. The thickness of the adhesive 10 is set to some tens of micrometers ($\mu$m).

After printing, the lead frames 3 are set on a die bonder. The sensor chip 6 and the IC chip 7 are bonded on the die pads 4, 5 with the adhesive 10, respectively. Thereafter, the adhesive 10 is heated to a predetermined temperature, which hardens the adhesive 10. The hardened adhesive 10 has elasticity. Thus, the sensor chip 6 is flexibly secured to the die pad 4, and the IC chip 7 is flexibly secured to the die pad 5.

After die bonding, the lead frames 3 are set on a wire bonder, and wire bonding is performed. That is, the sensor chip 6 and the IC chip 7 are electrically connected to the inner leads 3a by bonding wires W1.

After wire bonding, the lead frames 3 are set in a mold and molded with the mold member 2, such that the IC chip 7 is completely embedded in the mold member 2. On the other hand, the sensor chip 6 is located in the cylinder 8 such that the space 8a surrounds the sensor chip 6. Prior to the molding, the outer leads 3b may be bent with respect to the inner leads 3a. Alternatively, the outer leads 3b may be bent after molding.

After molding, the cylinder 8 is filled with the silicone gel 9, which completely seals the sensor chip 6. As a result, the acceleration sensor 1 shown in FIGS. 1 and 2 is manufactured.

Next, comparison experiments will be described. In these experiments, various types of mold members are used. FIG. 5 is a chart showing the characteristics of various mold members used in the experiments. Specifically, the chart shows the coefficient of linear expansion and the modulus of elasticity of the mold members.

The mold member of a sample A is polybutylene terephthalate (PBT). The coefficient of linear expansion of the sample A is $2.5 \times 10^{-5}/°$ C., and the modulus of elasticity of the sample A is $75 \times 10^3$ kg/cm$^2$. The coefficient of linear expansion and the modulus of elasticity of the sample A are outside of the above described preferable range.

The mold member of a sample B is polyphenylene sulfide (PPS). The coefficient of linear expansion of the sample B is $2.2 \times 10^{-5}/°$ C., and the modulus of elasticity of the sample B is $140 \times 10^3$ kg/cm$^2$. The coefficient of linear expansion and the modulus of elasticity of the sample B are outside of the above described preferable range.

The mold member of a sample C is an epoxy type. The coefficient of linear expansion of the sample C is $1.4 \times 10^{-5}/°$ C., and the modulus of elasticity of the sample C is $120 \times 10^3$ kg/cm$^2$. The coefficient of linear expansion and the modulus of elasticity of the sample C are within the above described preferable range.

The mold member of a sample D is an epoxy type. The coefficient of linear expansion of the sample D is $1.8 \times 10^{-5}/°$ C., and the modulus of elasticity of the sample D is $120 \times 10^3$ kg/cm$^2$. The coefficient of linear expansion and the modulus of elasticity of the sample D are within the above described preferable range.

The mold member of sample E is an epoxy type. The coefficient of linear expansion of the sample E is $1.5 \times 10^{-5}/°$ C., and the modulus of elasticity of the sample E is $120 \times 10^3$ kg/cm$^2$. The coefficient of linear expansion and the modulus of elasticity of the sample E are within the above described preferable range.

The mold member of a sample F is a silicone rubber type. The coefficient of linear expansion of the sample F is $1.7 \times 10^{-5}/°$ C., and the modulus of elasticity of the sample F is $113 \times 10^3$ kg/cm$^2$. The coefficient of linear expansion and the modulus of elasticity of the sample F are within the above described preferable range.

The mold member of a sample G is an epoxy type. The coefficient of linear expansion of the sample G is $1.9 \times 10^{-5}/°$ C., and the modulus of elasticity of the sample G is $200 \times 10^3$ kg/cm$^2$. The coefficient of linear expansion and the modulus of elasticity of the sample G are outside of the above described preferable range.

Acceleration sensors were made using the above samples A to G as the mold member 2. The TSS value of the sensors were measured. TSS is an abbreviation of "temperature sensitive shift" and represents the rate of change of sensitivity in a certain temperature range.

When the temperature is a reference temperature T1 and the pressure acting on the sensor is zero, the output voltage of the sensor is represented by V01. When the temperature is a reference temperature T1 and the pressure acting on the sensor is P1, the output voltage of the sensor is represented by V1. In this case, the output voltage Va per unit pressure is represented by the following equation (1).

$$Va = (V1 - V01)/P1 \tag{1}$$

When the temperature is a reference temperature T2, which is different from the temperature T1, and the pressure acting on the sensor is zero, the output voltage of the sensor is represented by V02. When the temperature is a reference temperature T2 and the pressure acting on the sensor is P2, the output voltage of the sensor is represented by V2. In this case, the output voltage Vb per unit pressure is represented by the following equation (2).

$$Vb=(V2-V02)/P2 \quad (2)$$

The TSS value (%) is represented by the following equation (3).

$$TSS=[(Vb-Va)/Va]\times 100 \quad (3)$$

Figure 4:
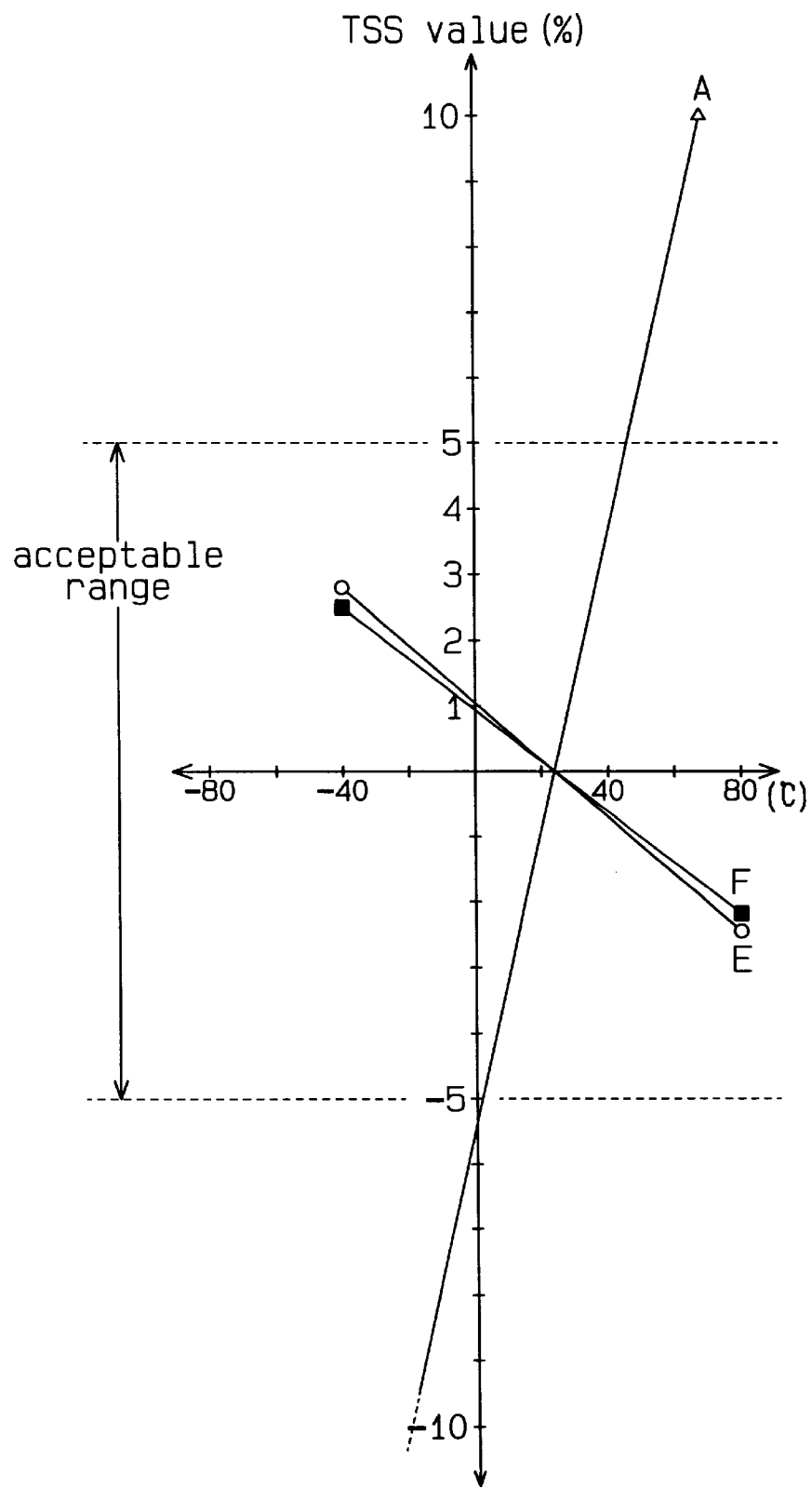
FIG. 4 is a graph showing the relationship between temperature and TSS value in sensors having various mold members.

In these experiments, the reference temperature T1 was set to an ordinary temperature (specifically 25° C.), the pressures P1, P2 acting on the sensor were set to +100 mmHg. The TSS values of the samples A to G were obtained when the temperature T2 was −40° C. and 80° C. Whether the obtained TSS values were in an acceptable range (±5%) was judged. The chart of FIG. 5 shows the result of the judgment. The TSS values in FIG. 5 are the greater ones of the value when the temperature T2 was −40° C. and the value when the temperature T2 is 80° C. The TSS values of the samples A, E and F are shown in the graph of FIG. 4 to visibly show the comparison results. The line through the white triangle (△) shows the changes of the TSS value of the sample A. The line through the white circle (○) shows the changes of the TSS value of the sample E. The line through the black square (■) shows changes of the TSS value of the sample F. Since the TSS values of the sensors using the samples C, D are very similar to the TSS values of the sensor using the sample E, the TSS values of the samples C, D are omitted in the graph of FIG. 4.

As shown in FIGS. 4 and 5, the TSS values of the sensors using the samples A, B, G are not in the acceptable range of ±5%. Therefore, the samples A, B, G are not suitable for the mold member in acceleration sensors.

On the other hand, the TSS values of the sensors using the samples C, D, E, F are in a range of ±3%. Thus, the samples C, D, E, F are suitable for the mold member in acceleration sensors. Particularly, the TSS value of the sensor using the sample F is extremely small. The sample F is very suitable for the mold member in acceleration sensors.

Next, thermal stress generated among the parts of the acceleration sensor 1 will be described with reference to FIG. 3. As described above, the materials in the sensor 1 each have the own thermal stress characteristics. Therefore, when the sensor 1 is exposed to temperature changes, thermal stress is generated among the parts of the sensor 1.

However, as shown in FIGS. 1 and 2, a relatively large part of the sensor 1 is occupied by the mold member 2. Further, the coefficient of linear expansion of the mold member 2, which is elastomer, is greater than that of the sensor chip 6 and the lead frames 3, which are metal. Thus, the mold member 2 is deformed by a greater amount by temperature changes than the sensor chip 6 and the lead frames 3.

Therefore, although the lead frames 3 have a relatively small coefficient of linear expansion, the lead frames 3 are deformed by stress produced by deformation of the mold member 2. In other words, the thermal stress of the parts other than the mold member 2 is greatly affected by the thermal stress acting on the mold member 2. When hardened, the adhesive 10 functions as an elastic body, or elastomer, that flexibly couples the sensor chip 6 to the die pad 4. The adhesive 10 therefore absorbs the stress. However, if the mold member 2 is not formed with a material having suitable characteristics, the adhesive 10 cannot sufficiently absorb the stress. As a result, the diaphragm 6b is greatly deformed.

In this embodiment, the material used for the mold member 2 has suitable characteristics (the coefficient of linear expansion and the modulus of elasticity), which decreases difference of the thermal stress amount among the parts. This allows the adhesive 10 to sufficiently absorb stress. Even if the mold member 2 and the lead frames 3 are deformed by heat, the stress produced by the deformation is thought to be sufficiently absorbed by the adhesive 10. The stress therefore will not affect the diaphragm 6b. Accordingly, the diaphragm 6b is not deformed and the ratio of change of sensitivity is relatively small, or within ±3%. Thus, the acceleration sensor 1 has improved thermal characteristics.

Conventionally, a sensor chip is flexibly adhered to a ceramic substrate to decrease the ratio of change of sensitivity due to temperature changes. Alternatively, a separate compensation circuit is connected to a sensor. The illustrated embodiment reduces the ratio of change of sensor sensitivity due to temperature changes within ±5% without using the conventional measures. Therefore, the illustrated embodiment needs neither a ceramic substrate or a compensation circuit. This reduces the manufacturing cost of the sensor 1 and facilitates manufacturing. As a result, the productivity of the manufacturing is improved.

It should be apparent to those skilled in the art that the present invention may be embodied in many other specific forms without departing from the spirit or scope of the invention. Particularly, it should be understood that the invention may be embodied in the following forms.

The lead frames 3 may be made of an iron alloy having a composition other than that of the 42 alloy. For example, the lead frames 3 may be made of Kovar, in which the percentage by weight of nickel is 29% and the percentage by weight of cobalt is 17%, of 46 alloy, in which the percentage by weight of nickel is 46%, or of 52 alloy, in which the percentage by weight of nickel is 52%. Alternatively, the lead frames 3 may be made of an iron alloy in which the percentage by weight of nickel is 42% and the percentage by weight of chromium is 6% or of an iron alloy in which the percentage by weight of nickel is 45% and the percentage by weight of chromium is 6%. These iron alloys have similar compositions as the 42 alloy and therefore have similar physical properties.

Not only silicone rubber type, but also nonsilicone type may be used as the adhesive 10. As long as a sensor chip is flexibly secured to a die pad, the adhesive 10 may be a fluorine type, soft epoxy, or urethane type.

Instead of the silicone gel 9, silicone oil may be used as a sealing material.

The strain gauges 11, which are resistors forming the bridge circuit, may be manufactured by methods other than thin film forming. For example, the bridge circuit may comprise resistors formed by printing, pasting or impurity scattering.

Other than the acceleration sensor 1 using the sensor chip 6, the present invention may be embodied in a pressure sensor using the sensor chip 6.

What is claimed is:

1. A sensor comprising:
    a lead frame including a die pad;
    a sensor chip flexibly secured to the die pad with an adhesive, wherein the sensor chip includes a diaphragm and outputs signals corresponding to a strain amount of the diaphragm;

a mold member molded about the lead frame, wherein the mold member defines a space about the sensor chip, characterized in that:

the coefficient of linear expansion of the mold member is between $1.4 \times 10^{-5}/°C$ and $1.8 \times 10^{-5}/°C$, and the modulus of elasticity of the mold member is between $100 \times 10^3$ kg/cm$^2$ and $130 \times 10^3$ kg/cm$^2$.

2. The sensor according to claim 1, characterized in that the coefficient of linear expansion of the mold member is between $1.6 \times 10^{-5}/°C$ and $1.7 \times 10^5/°C$, and the modulus of elasticity of the mold member is between $105 \times 10^3$ kg/cm$^2$ and $115 \times 10^3$ kg/cm$^2$.

3. The sensor according to claim 1, characterized in that the sensor chip is made of silicon.

4. The sensor according to claim 1, characterized in that the lead frame is made of 42 alloy, the thickness of which is between 0.25 mm and 0.5 mm.

5. The sensor according to claim 1, characterized in that the adhesive is a silicone rubber type.

6. The sensor according to claim 1, characterized in that the mold member is made of insulation that is an epoxy type or a silicone rubber type.

7. The sensor according to claim 1, characterized in that the sensor chip includes a resistor, the mold member includes a cylinder surrounding the sensor chip to define a space about the sensor chip, the cylinder being filled with a gel for sealing the sensor chip, wherein the gel transmits acceleration acting on the sensor to the diaphragm, and the diaphragm is flexed in accordance with the acceleration, and wherein the resistance of the resistor varies in accordance with the flexure of the diaphragm.

* * * * *